United States Patent
Varghese et al.

(10) Patent No.: US 10,629,437 B2
(45) Date of Patent: Apr. 21, 2020

(54) TECHNIQUES AND STRUCTURE FOR FORMING DYNAMIC RANDOM-ACCESS DEVICE USING ANGLED IONS

(71) Applicant: Varian Semiconductor Equipment Associates, Inc., Gloucester, MA (US)

(72) Inventors: Sony Varghese, Manchester, MA (US); John Hautala, Beverly, MA (US); Steven R. Sherman, Newton, MA (US); Rajesh Prasad, Lexington, MA (US); Min Gyu Sung, Essex, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 42 days.

(21) Appl. No.: 16/117,980

(22) Filed: Aug. 30, 2018

(65) Prior Publication Data

US 2019/0348287 A1    Nov. 14, 2019

Related U.S. Application Data

(60) Provisional application No. 62/669,167, filed on May 9, 2018.

(51) Int. Cl.
*H01L 21/033* (2006.01)
*H01L 21/3215* (2006.01)
*H01L 21/311* (2006.01)
*H01L 27/108* (2006.01)
*H01L 21/3115* (2006.01)

(52) U.S. Cl.
CPC ...... *H01L 21/0337* (2013.01); *H01L 21/0332* (2013.01); *H01L 21/31105* (2013.01); *H01L 21/31155* (2013.01); *H01L 21/32155* (2013.01); *H01L 27/10844* (2013.01)

(58) Field of Classification Search
CPC ......... H01L 27/10844; H01L 21/31155; H01L 21/0337; H01L 21/32155; H01L 21/31105; H01L 21/0332
See application file for complete search history.

(56) References Cited

U.S. PATENT DOCUMENTS

| | | | |
|---|---|---|---|
| 6,960,510 B2 * | 11/2005 | Deshpande | ......... H01L 21/0337 257/E21.038 |
| 8,629,048 B1 * | 1/2014 | Sipani | ................. H01L 21/0337 438/587 |

(Continued)

*Primary Examiner* — Savitri Mulpuri

(57) ABSTRACT

A method may include providing a substrate, comprising a patterning layer. The method may include forming a first pattern of first linear structures in the patterning layer, the first linear structures being elongated along a first direction. The method may include forming a mask over the patterning layer, the mask comprising a second pattern of second linear structures, elongated along a second direction, forming a non-zero angle with respect to the first direction. The method may include selectively removing a portion of the patterning layer while the mask is in place, wherein a first etch pattern is formed in the patterning stack, the first etch pattern comprising a two-dimensional array of cavities. The method may include directionally etching the first etch pattern using an angled ion beam, wherein a second etch pattern is formed, comprising the two-dimensional array of cavities, elongated along the first direction.

17 Claims, 8 Drawing Sheets

(56) References Cited

U.S. PATENT DOCUMENTS

| | | | |
|---|---|---|---|
| 2011/0021927 A1* | 1/2011 | Sawanoi | A61B 5/02255 |
| | | | 600/479 |
| 2017/0162384 A1* | 6/2017 | Chen | C23C 16/513 |
| 2017/0263460 A1* | 9/2017 | Ruffell | H01J 37/32403 |
| 2017/0299960 A1* | 10/2017 | Parker | G03F 7/0005 |
| 2018/0197740 A1* | 7/2018 | Lee | H01L 21/0338 |
| 2019/0139964 A1* | 5/2019 | Varghese | H01L 27/10823 |

* cited by examiner

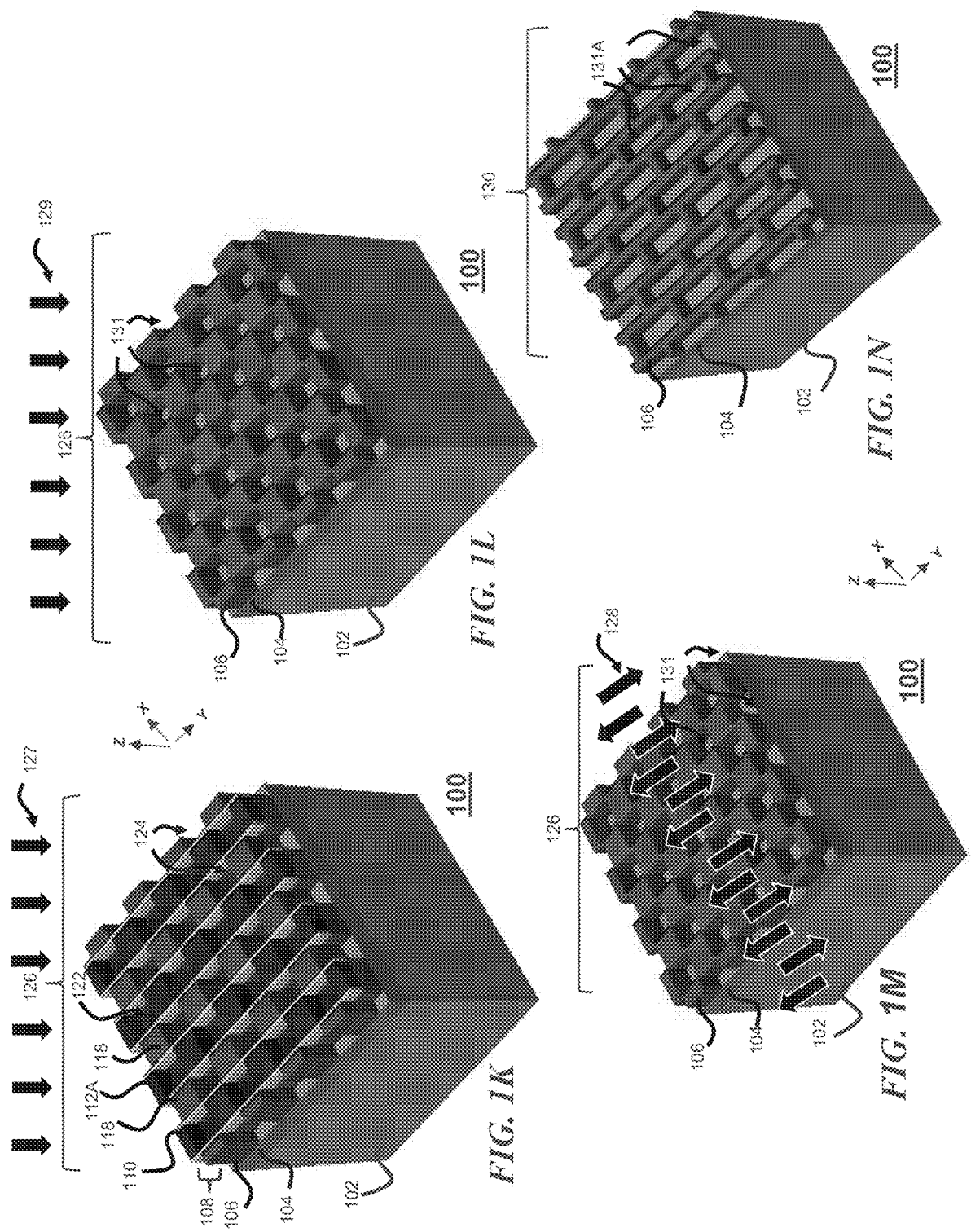

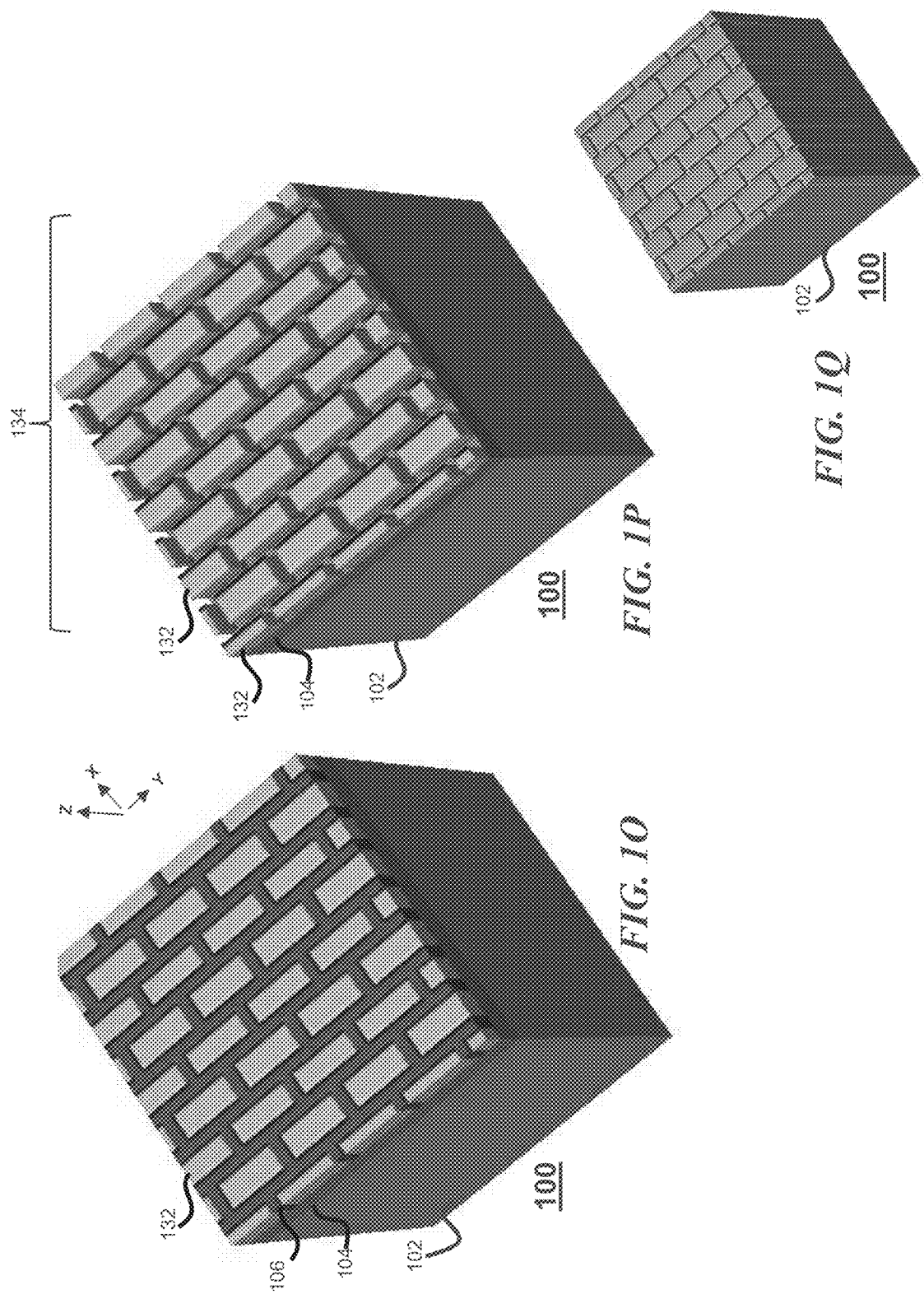

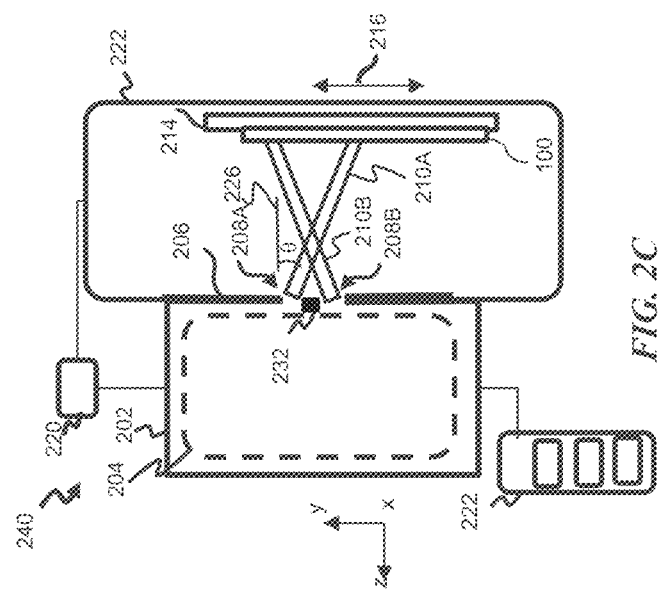
FIG. 2C
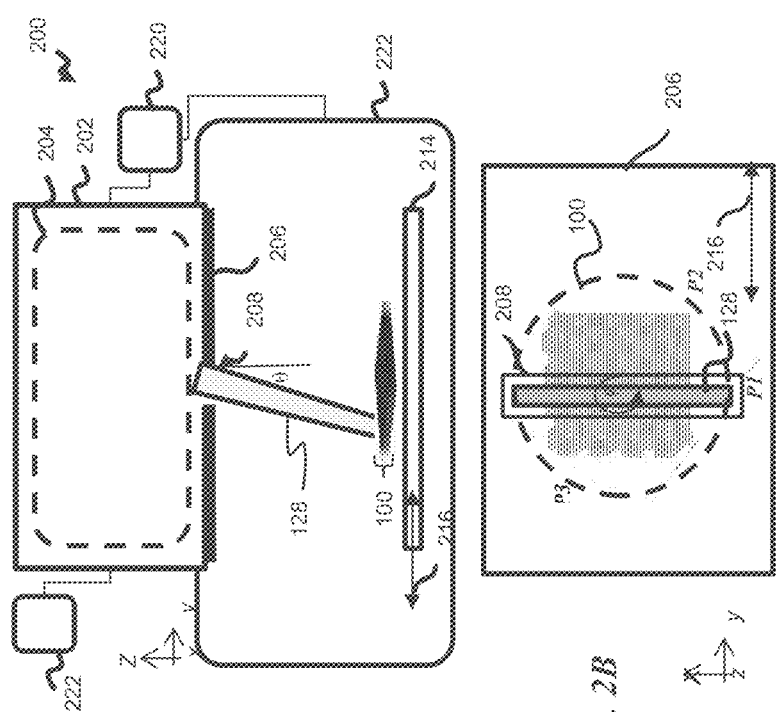
FIG. 2A
FIG. 2B

TECHNIQUES AND STRUCTURE FOR FORMING DYNAMIC RANDOM-ACCESS DEVICE USING ANGLED IONS

RELATED APPLICATIONS

This application claims priority to U.S. Provisional patent application No. 62/669,167, filed May 9, 2018, entitled TECHNIQUES AND STRUCTURE FOR FORMING DYNAMIC RANDOM-ACCESS DEVICE USING ANGLED IONS, and incorporated by reference herein in its entirety.

FIELD

The present embodiments relate to semiconductor substrates, and more particularly, to processing for dynamic random access device.

BACKGROUND

As dynamic random-access memory (DRAM) devices scale to smaller dimensions, an increasing emphasis is placed on patterning in forming three dimensional structures, including trenches for storage nodes as well as access transistors. In present day DRAM devices, transistors may be formed using narrow and tall semiconductor fin structures, often made from monocrystalline silicon. In present technology, a two-dimensional array of fin structures is formed by patterning a series of linear structures, where the linear structures are subsequently truncated using a chop mask. Because of the reduction in dimensions, misaligned chop mask may result in defective fin structures, while overlay tolerance is decreasing with each reduction in array pitch.

With respect to these and other considerations, the present disclosure is provided.

BRIEF SUMMARY

In one embodiment, a method may include providing a substrate, the substrate comprising a patterning stack, the patterning stack comprising a patterning layer. The method may also include forming a first pattern, comprising first linear structures, in the patterning layer, the first linear structures being elongated along a first direction. The method may include forming a mask over the patterning layer, the mask comprising a second pattern, comprising second linear structures, the second linear structures being elongated along a second direction, the second direction forming a non-zero angle with respect to the first direction. The method may also include selectively removing a portion of the patterning layer while the mask is in place, wherein a first etch pattern is formed in the patterning stack, the first etch pattern comprising a two-dimensional array of cavities. The method may further include directionally etching the first etch pattern using an angled ion beam, wherein a second etch pattern is formed, the second etch pattern comprising the two-dimensional array of cavities, elongated along the first direction.

In an additional embodiment, a method may include providing a substrate, the substrate comprising a substrate base and a patterning stack, disposed on the substrate base, the patterning stack comprising a patterning layer. The method may include forming a first etch pattern in the patterning stack, the first etch pattern comprising a two-dimensional array of cavities. The method may also include directionally etching the first etch pattern using an angled ion beam, wherein a second etch pattern is formed, the second etch pattern comprising the two-dimensional array of cavities, elongated along a first direction. The method may further include performing a tone reversal of the second etch pattern, to form an isolation pattern within a patterning stack layer of the patterning stack, subjacent to the patterning layer, and transferring the isolation pattern into the substrate, wherein an active memory array is formed.

In a further embodiment, a method of forming a memory array, may include providing a substrate, the substrate comprising a substrate base, formed of monocrystalline semiconductor, and a patterning stack, disposed on the substrate base. The patterning stack may include a patterning layer, formed of amorphous silicon, and at least one additional layer, subjacent the patterning layer. The method may also include forming a first etch pattern in the patterning stack, the first etch pattern comprising a two-dimensional array of cavities. The method may include directionally etching the first etch pattern using an angled ion beam, wherein a second etch pattern is formed, the second etch pattern comprising the two-dimensional array of cavities, elongated along a first direction. The method may additionally include performing a tone reversal of the second etch pattern, to form an isolation pattern within the at least one additional layer; and transferring the isolation pattern into the substrate, wherein an active memory array is formed in the substrate base.

BRIEF DESCRIPTION OF THE DRAWINGS

FIG. 2A and FIG. 2B show a side view and a top view, respectively, of a processing apparatus according to embodiments of the disclosure;

FIG. 2C shows a side view of another processing apparatus according to embodiments of the disclosure;

DETAILED DESCRIPTION

Figure 1A:
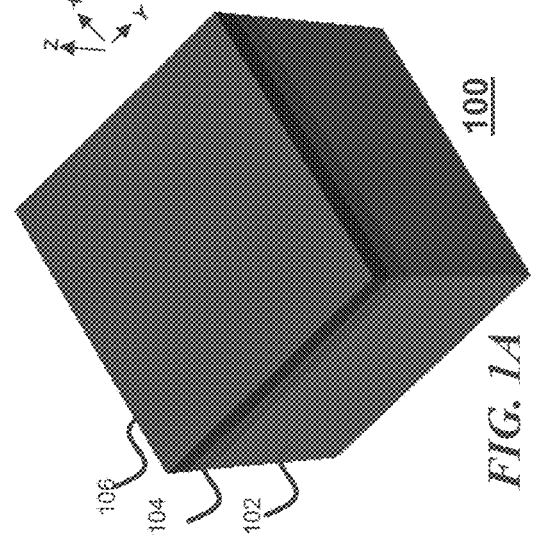
FIG. 1A to FIG. 1Q depict exemplary operations involved in a method according to embodiments of the disclosure.

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

Figure 1B:
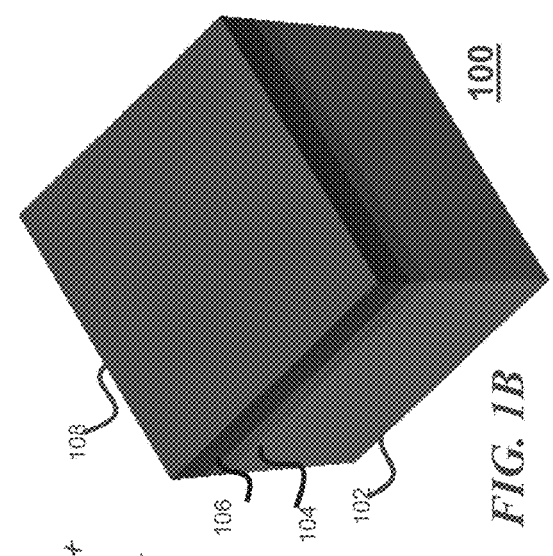

The present embodiments provide novel techniques and substrate structures to form devices, such as transistors, formed from semiconductor fin structures. These techniques may especially be applicable to formation of DRAM devices, while other devices may also be formed according to the embodiments of the disclosure. Various non-limiting embodiments are particularly useful for implementation where the width of fin structures or pitch between fin structures is less than 50 nm, and in some embodiments, 20 nm or less FIG. 1A to FIG. 1Q depict exemplary operations involved in a method according to embodiments of the disclosure. At FIG. 1A, a substrate 100 is provided, including a substrate base 102. The substrate base 102 may be a monocrystalline semiconductor such as monocrystalline silicon. As detailed below, a patterning stack made of a plurality of layers is formed on the substrate base 102. At FIG. 1A, a first layer 104 is disposed on the substrate base 102, while a second layer 106 is disposed on the first layer 104. In some embodiments, the first layer may be silicon nitride, while the second layer 106 is a different material, such as carbon, including a spin-on carbon material as known in the art. At FIG. 1B, a third layer 108 is provided on the second layer 106. In accordance with embodiments of the disclosure, the third layer 108 may be initially formed of one material, while subsequent patterning, etching, and implantation may be performed to transform the third layer 108 into a plurality of structures as well as materials, where the third layer 108 is transformed into a patterning layer. In some embodiments, the third layer is formed of amorphous silicon. As discussed below, amorphous silicon may be a particularly suitable material for forming patterning structures because amorphous silicon may be readily modified to modify etching properties for example. The embodiments are not limited in this context, while other materials may be used for third layer 108.

Figure 1C:
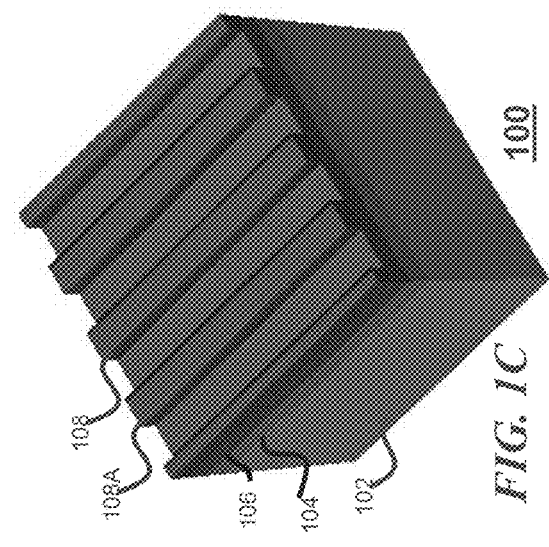

At FIG. 1C, a plurality of first linear structures, shown as linear structures 108A, are formed in the third layer 108. The linear structures 108A are elongated along a first direction, represented by the Y-axis of the Cartesian coordinate system shown. The linear structures 108A may be used to pattern underlying layers in the substrate 100, including in the first layer 104 and second layer 106. The linear structures 108A may be patterned with a pitch arranged according to design rules for a DRAM array. As such, the pitch along the X-axis may be less than 50 nm in some examples, and less than 40 nm in particular examples. Formation of the linear structures 108A may be accomplished using known lithography approaches, such as self-aligned double patterning (SADP) of self-aligned quadruple patterning (SAQP).

Figure 1D:
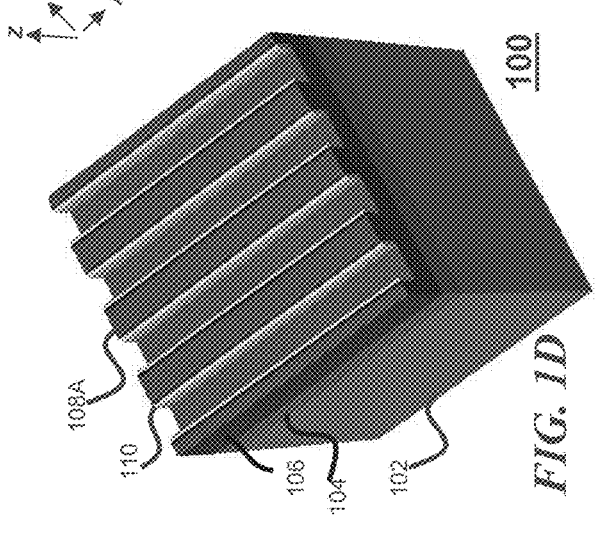

At FIG. 1D, a subsequent instance is shown, after deposition of a spacer film and patterning of the spacer film to form spacers 110, along the sidewalls of the linear structures 108A. According to various embodiments, the spacers 110 may be formed of a material, different from the material of the linear structures 108A, as well as different from the material of second layer 106. Examples of suitable materials for spacers 110 include SiCN material or SiBN material, meaning mixtures of silicon, nitrogen, and carbon or boron. The embodiments are not limited in this context. Notably, the thickness of the layer to form spacers 110 may be designed to impart a target width of the spacers 110 along the direction perpendicular to the long direction of the linear structures 108A, that is, along the X-axis. Thus, to form spacers 110 with a width of 10 nm along the X-axis, a layer of approximately 10 nm may be conformally deposited over the structure of FIG. 1C, followed by directional etching to remove the layer from horizontal surfaces (parallel to the X-Y plane).

Figure 1E:
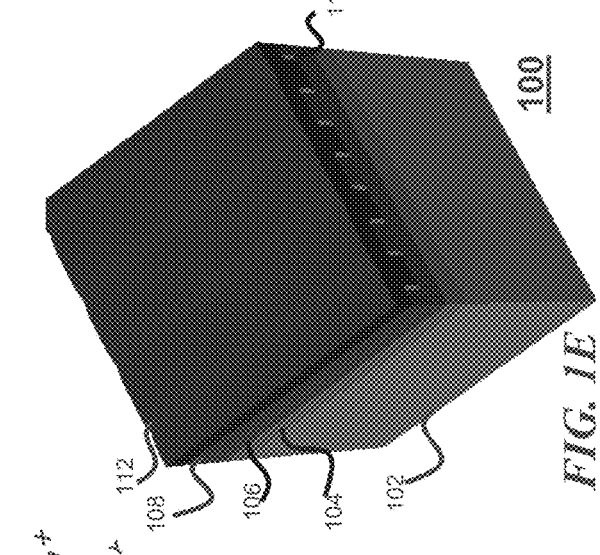
Figure 1F:
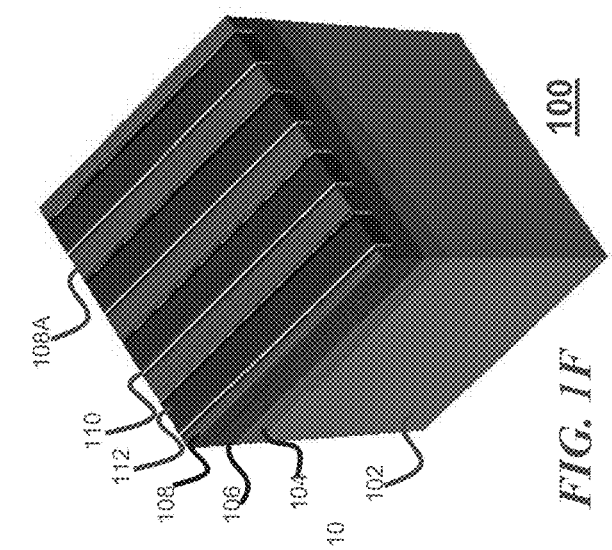

At FIG. 1E a subsequent instance is shown after deposition of a fill material 112. The fill material 112 may be deposited in a blanket deposition to cover all the structures at the surface of the substrate 100 shown in FIG. 1D. Examples of a suitable fill material include a fill oxide, such as silicon oxide. The fill material 112 may generally differ from the material of the linear structures 108A. Thus, the fill material may be amorphous silicon in one embodiment, while the linear structure 108A are formed of silicon oxide. The embodiments are not limited in this context. The fill material 112 may also fill regions between the linear structures 108A, as shown. At FIG. 1F, a subsequent instance is shown after planarization of the fill material 112 to remove fill material 112 from regions above the linear structures 108A and spacers 110. Thus, the patterning layer, third layer 108, comprises regions of the fill material 112, interspersed between the linear structures 108A.

A planarization process may be performed by a suitable method, including chemical mechanical polishing (CMP) or plasma or ion beam etching. As such, the third layer 108 has been modified to become a patterning layer, including the linear structures 108A, composed of a material such as amorphous silicon, and the fill material 112, arranged in linear regions between the linear structures 108A.

Figure 1G:
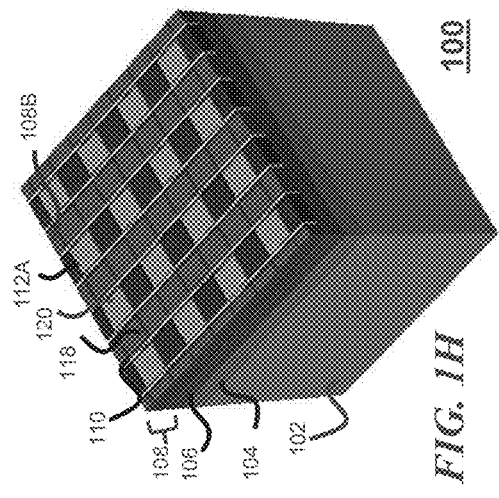

At FIG. 1G, there is shown a subsequent instance where a mask 114 has been formed over the patterning layer, that is, over the third layer 108. The mask 114 may be a suitable material such as photoresist, patterned into a second pattern of second linear structures, where the second linear structures being elongated along a second direction, different from the first direction for the linear structures 108A. Notably, the second direction may form a non-zero angle with respect to the first direction, such as ninety degrees. In other embodiments, the non-zero angle may be different than ninety degrees. In the example of FIG. 1G, the second linear structures of the mask 114 may extend along the X-axis, to serve as a chop mask for creating a two-dimensional isolation structure for active devices to be formed in substrate 100. Advantageously, the pitch of the linear structures of mask 114 may be relatively large, such as 50 nm, 80 nm, or 100 nm in some examples. Thus, the mask 114 may be formed using known lithography approaches, such as deep ultraviolet lithography, including 193 nm lithography. One example of a pattern for mask 114 is equal line and space. The embodiments are not limited in this context.

In the instance of FIG. 1G, ions 116 are directed to the substrate 100. The ions 116 may implant into portions of the patterning layer, third layer 108, in exposed regions of the mask 114, meaning regions not covered by material of mask 114. Suitable ions for ions 116 include carbon, nitrogen, oxygen, helium, hydrogen, or other materials. The ions 116 may be provided by any suitable apparatus, including beamline implanter, plasma tool, compact ion beam source, or other apparatus. A role of ions 116 is to alter the properties of materials being implanted, including the etch rate of such materials. Accordingly, the choice of ion species for ions 116 may depend upon the combination of materials present in the third layer 108 during exposure to the ions 116. In one example, where the original material of third layer 108, now present in regions 108B, is amorphous silicon, the ions 116 may be carbon ions. In portions of the regions 108B impacted by the carbon ions, the regions may transform to silicon carbide (not necessarily stochiometric SiC), where a suitable thickness of silicon carbide is determined by the energy and dose of ions 116, as will be apparent to those of skill in the art. For example, a 30-nm thick SiC layer may be formed by implanting an amorphous silicon layer with 5.5 keV $C^+$ ions at a dose of 2.5 E15/cm$^2$. In some examples, multiple implants at different ion energies may be performed to obtain a box-like profile of C in the initially-silicon layer, if desired.

As such, the nature of the third layer 108 is altered, so the third layer 108 becomes a patterning layer suitable to generate a two-dimensional array of cavities, as described with respect to the figures to follow. Turning now to FIG.

Figure 1H:
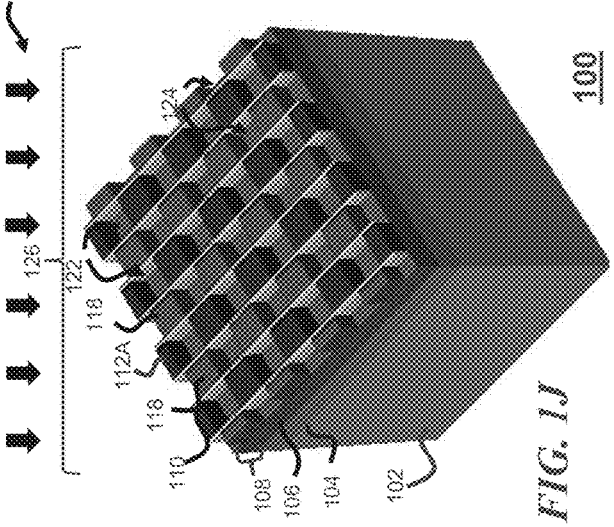

1H, there is shown a view of the surface of the third layer 108 after the implant operation. Notably, in FIG. 1H, the mask 114 is removed, while in various embodiments the mask 114 actually remains in place for further processing, shown in FIG. 1I. After the implantation of FIG. 1G, the regions 108B represent the original material of the layer 108, such as amorphous silicon, and are actually covered by the mask 114. The regions 112A represent the truncated portions of the fill material 112, while the regions 118 represented implanted regions of the linear structures 108A. Thus, in one example, the regions 118 and regions 108B form an array of alternating rectangular regions, composed alternately of amorphous silicon and silicon carbide. The regions 120 represent implanted portions or unimplanted regions of the fill material 112, alternating with the regions 112A, such as a fill oxide region, alternating with a carbon-implanted oxide region. In some examples, etch rate for suitable etchants may not vary substantially between regions 112A and regions 120, or the etch rate of regions 120 may exceed the etch rate of regions 112A. Notably, portions of the spacers 110 are also implanted, while not separately demarcated for clarity. In examples where the spacers 110 are SiCN or SiBN, implantation with carbon may result in little change in etch rate for etchants to follow, or may decrease the etch rate.

Figure 1I:
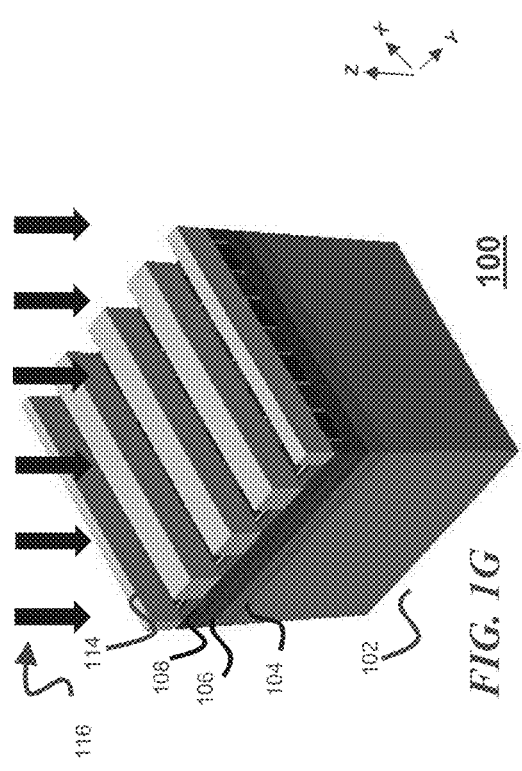

Turning now to FIG. 1I, there is shown a subsequent instance after the operation of FIG. 1G. In detail, after implantation with ions 116, with the mask 114 still in place, an etchant 121 is provided to the substrate 100 to selectively etch material from the regions 120, such as selectively etching implanted oxide with respect to SiC regions of regions 118, as well as with respect to SiCN or SiBN of spacers 110, as is known in the art. As such, cavities 122 are formed, exposing portions of second layer 106.

Figure 1J:
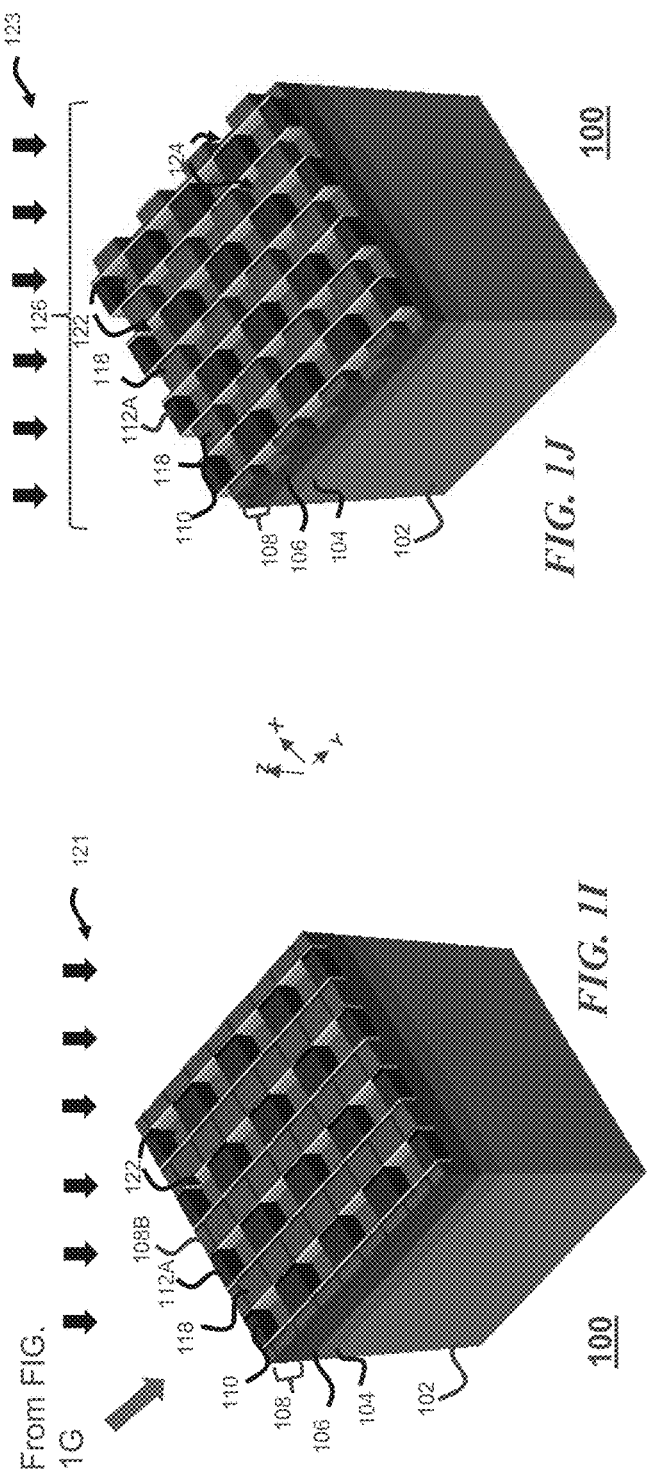

Turning to FIG. 1J, there is shown a subsequent instance after the mask 114, such as photoresist, is removed, and after an etchant 123 is provided to the substrate 100 to selectively remove regions 108B. In one example, where the regions 108B are amorphous silicon, the etchant may be designed to selectively etch amorphous silicon with respect to SiC (regions 118), silicon nitride (second layer 106), oxide (regions 112A), and SiCN, or SiBN (spacer 110), as is known in the art. As such, while regions 108B are removed, forming cavities 124, and exposing additional portions of second layer 106, the other structures of third layer 108 remain intact. The remaining structures form a rectangular "checkerboard" patterning layer, generating a first etch pattern 126.

Turning to FIG. 1K, there is shown a subsequent instance where the first etch pattern 126 is transferred into the second layer 106. In some examples, the transfer of the first etch pattern 126 is accomplished by providing an etchant 127 to the substrate 100, where the etchant 127 selectively etches spin-on carbon with respect to silicon nitride and silicon oxide, as known in the art.

Turning to FIG. 1L, there is shown a subsequent instance after the removal of third layer 108, the original patterning layer. This removal may be accomplished by providing an etchant 129 to the substrate 100, where the etchant 129 selectively etches oxide, SiCN or SiBN (for the spacers 110), SiC (for example, for regions 118), amorphous silicon (for unimplanted silicon below regions 118), with respect to silicon nitride and spin-on carbon (for example, for second layer 106), as known in the art. As such, the first etch pattern 126 is embodied in the second layer 106, as a spin on carbon layer. While the operation of FIG. 1K and FIG. 1L depicts transfer of the first etch pattern 126 into just the second layer 106, in other embodiments, the first etch pattern 126 may be transferred into two or more layers of a patterning stack, such as the first layer 104, as well as the second layer.

Turning to FIG. 1M, there is shown a subsequent instance where the first etch pattern 126 is exposed to a directional etch using an angled ion beam 128, where the geometry of the angled ion beam 128 is explained in further detail with respect to FIG. 2A and FIG. 2B. In brief, the angled ion beam 128 may be provided as a ribbon ion beam forming a non-zero angle of incidence with respect to a perpendicular to a plane of the substrate 100 (X-Y plane), meaning with respect to the Z-axis. The angled ion beam 128 acts to etch portions of the second layer 106, and in particular, select sidewalls of the cavities used to define the first etch pattern 126. For example, the angled ion beam 128 may be provided as a directional ion beam where the ions of angled ion beam 128 are directed to just strike sidewalls of the cavities 131, oriented along the X-Z plane, while not striking sidewalls oriented along the Y-Z plane. In some embodiments, the angled ion beam 128 may be provided a pair of ion beams, oriented parallel to certain sidewalls, such as the sidewalls oriented along the Y-Z plane, while striking opposite sidewalls, as suggested in FIG. 1M. As such, as second etch pattern 130 is formed, as shown in FIG. 1N, where the second etch pattern 130 comprises a two-dimensional array of cavities, shown as cavities 131A, elongated along the first direction, along the X-axis. Notably, the angled ion beam 128 may be provided as part of a reactive ion etching recipe for selectively etching spin-on-carbon with respect to silicon nitride, as known in the art. In addition, etch selectivity for etching the cavities 131 along the Y axis with respect to X axis of up to 15/1 or greater may be realized. Thus, the cavities 131A retain dimensions of cavities 131 along the X-axis, while being elongated to a designed amount along the Y-axis.

At FIG. 1O and FIG. 1P there is shown a subsequent set of operations where a tone reversal of the second etch pattern 130 is performed. In various embodiments, the tone reversal may be accomplished by depositing a reversing layer comprising reversing layer material on a patterning stack layer, after the second etch pattern 130 is formed, followed by planarizing the reversing layer. Subsequently, selective etching of the layer material of the patterning stack layer may be performed with respect to the reversing layer material, to remove the layer material, leaving the reversing layer material as a mask or structure having a reversed tone to the second etch pattern 130. For example, in some embodiments the tone reversal is realized by depositing an oxide 132 and planarizing the oxide, as shown in FIG. 1O, followed by selectively etching the material of second layer 106, such as spin-on carbon, with to the oxide 132. The remaining pattern forms an isolation pattern 134 comprised of oxide or other suitable islands. The isolation pattern 134 may subsequently be transferred into underlayers, such as the first layer 104, and from there to the substrate base 102, forming a final active array as shown in FIG. 1Q. Notably, while in some embodiments, the first layer 104 may be just one layer, such as silicon nitride, in other embodiments, the first layer 104 may be divided into two layers, such as silicon nitride and TiN.

To perform the operation generally shown at FIG. 1M, according to some embodiments, a substrate may be placed in a process chamber of an apparatus having an adjacent plasma chamber. The directional ion beam may be extracted from the plasma chamber into the process chamber through an extraction aperture, defining the size and shape of the ion beam. In particular embodiments, the ion beam forms a trajectory defining a non-zero angle of incidence with respect to normal to the substrate plane, as explained below. This geometry allows the ion beam to be directed in a targeted manner to select sidewalls, while leaving other sidewalls unimpacted by the ion beam.

Turning now to FIG. 2A, there is shown a processing apparatus 200, depicted in schematic form. The processing apparatus 200 represents a processing apparatus for selectively etching portions of a substrate, such as sidewalls. The processing apparatus 200 may be a plasma based processing system having a plasma chamber 202 for generating a plasma 204 therein by any convenient method as known in the art. An extraction plate 206 may be provided as shown, having an extraction aperture 208, where a selective etching may be performed to selectively remove sidewall layers. A substrate 100, such as a substrate 100 having the aforementioned structure as shown at FIG. 1M, is disposed in the process chamber 222. A substrate plane of the substrate 100 is represented by the X-Y plane of the Cartesian coordinate system shown, while a perpendicular to the plane of the substrate 100 lies along the Z-axis (Z-direction).

During a directional etching operation, the angled ion beam 128 is extracted through the extraction aperture 208 as shown. The angled ion beam 128 may be extracted when a voltage difference is applied using bias supply 220 between the plasma chamber 202 and substrate 100 as in known systems. The bias supply 220 may be coupled to the process chamber 222, for example, where the process chamber 222 and substrate 100 are held at the same potential. In various embodiments, the angled ion beam 128 may be extracted as a continuous beam or as a pulsed ion beam as in known systems. For example, the bias supply 220 may be configured to supply a voltage difference between plasma chamber 202 and process chamber 222, as a pulsed DC voltage, where the voltage, pulse frequency, and duty cycle of the pulsed voltage may be independently adjusted from one another.

By scanning a substrate 100 with respect to the extraction aperture 208, and thus with respect to the angled ion beam 128, along the scan direction 216, the angled ion beam 128 may etch targeted surfaces of structures, such as the cavities 131A, when such structures are oriented, for example, perpendicularly to the scan direction 216, as further shown in FIG. 2B. In various embodiments, for example, the angled ion beam 128 may be provided as a ribbon ion beam having a long axis extending along the X-direction of the Cartesian coordinate system shown in FIG. 2B. The substrate 100 may be arranged, for example, where one set of sidewalls of the cavities 131 is exposed to the angled ion beam 128. For example, the cavities 131 may be oriented with the long direction of the linear structures 108A (Y-axis) is perpendicular to the long axis of the extraction aperture, along the X-axis. In this manner, as shown in FIG. 2A, the angled ion beam 128, forming a non-zero angle of incidence with respect to the Z-axis (normal to the substrate plane), may strike the sidewalls oriented along the X-Z plane, as noted. This geometry facilitates reactive ion etching of the X-Z sidewalls, while not etching the Y-Z sidewalls, and thus selectively elongates the cavities 131 to generate the elongated structure of cavities 131A, as shown in FIG. 1N. In various embodiments, the value of the non-zero angle of incidence may vary from 10 degrees to 75 degrees, while in some embodiments the value may range between 20 degrees and 60 degrees. The embodiments are not limited in this context. The angled ion beam 128 may be composed of any convenient gas mixture, including inert gas, reactive gas, and may be provided in conjunction with other gaseous species in some embodiments. In particular embodiments, the angled ion beam 128 and other reactive species may be provided as an etch recipe to the substrate 100 so as to perform a directed reactive ion etching of targeted sidewalls of patterning layers on substrate 100. The etch recipe may be selective with respect to the material of the first layer 104, so as to remove material of the second layer 106, while not etching the first layer 104, or etching the first layer 104 to a lesser extent.

In this example of FIG. 2B, the substrate 100 is a circular wafer, such as a silicon wafer, the extraction aperture 208 is an elongated aperture, having an elongated shape. The angled ion beam 128 is provided as a ribbon ion beam extending to a beam width along the X-direction, where the beam width is adequate to expose an entire width of the substrate 100, even at the widest part along the X-direction. Exemplary beam widths may be in the range of 10 cm, 20 cm, 30 cm, or more while exemplary beam lengths along the Y-direction may be in the range of 3 mm, 5 mm, 10 mm, or 20 mm. The embodiments are not limited in this context.

As also indicated in FIG. 2B, the substrate 100 may be scanned in the scan direction 216, where the scan direction 216 lies in the X-Y plane, such as along the Y-direction. Notably, the scan direction 216 may represent the scanning of substrate 100 in two opposing (180 degrees) directions along the Y-direction, or just a scan toward the left or a scan toward the right. As shown in FIG. 2B, the long axis of angled ion beam 128 extends along the X-direction, perpendicularly to the scan direction 216. Accordingly, an entirety of the substrate 100 may be exposed to the angled ion beam 128 when scanning of the substrate 100 takes place along a scan direction 216 to an adequate length from a left side to right side of substrate 100 as shown in FIG. 2B.

As also shown in FIG. 2B, the exposure of substrate 100 to the angled ion beam 128 may take place when the substrate 100 is scanned while disposed at a first rotational position as indicated by the position P1 on substrate 100 being located under the location L on the extraction plate 206. For example, the position P1 may correspond to the position of a notch or a flat on a wafer. In accordance with various embodiments, a plurality of scans may be performed to selectively remove sidewall spacers from different sidewalls, where the substrate 100 may be rotated through a plurality of different rotational positions, as noted. For example, the position P2 may represent a position lying on a radius of substrate 100 rotated at a given twist angle, such as the non-zero angle $\phi$ defined with respect to the angle between the linear structures 108A.

Accordingly, in the substrate 100 may be rotated with respect to a perpendicular or a perpendicular plane to the X-Y plane, through a twist angle of 180 degrees with respect to the rotational position of FIG. 2B. Processing of the substrate 100 in this second rotational position may proceed similarly to processing in the rotational position of FIG. 2B, where the substrate 100 is again scanned along the scan direction 216 to expose an entirety of substrate 100 to the angled ion beam 128 in a second scan. This second operation in the second rotational position may expose a set of sidewalls of the cavities 131 opposite the first set of sidewalls so as to elongate the cavities 131 in two opposing directions along the Y-axis.

Turning now to FIG. 2C, there is shown another processing apparatus 240, depicted in schematic form. The processing apparatus 240 represents a processing apparatus for performing angled ion treatment of a substrate, and may be substantially the same as the processing apparatus 200, save for the differences discussed below. Notably, the processing apparatus 240 includes a beam blocker 232, disposed adjacent the extraction aperture 208. The beam blocker 232 is sized and positioned to define a first aperture 208A and a second aperture 208B, where the first aperture 208A forms a first angled ion beam 210A, and the second aperture 208B forms a second angled ion beam 210B. The two angled ion beams may define angles of incidence with respect to the perpendicular 226, equal in magnitude, opposite in direction. The beam blocker offset along the Z-axis with respect to extraction plate 206 may help define the angle of the angled ion beams. As such, the first angled ion beam 210A and the second angled ion beam 210B may treat opposing sidewalls of a semiconductor fin similarly and simultaneously, as generally depicted in FIG. 2C. When configured in the shape of a ribbon beam as in FIG. 2B, these angled ion beams may expose an entirety of the substrate 100 to reactive ion etching of the cavities 131 distributed in devices across the substrate 100, by scanning the substrate platen 214 as shown. In this configuration opposite sidewalls of the cavities 131 may be etched simultaneously, elongating the cavities 131 in two opposite directions along the Y-axis in one scan operation.

In targeted experiments selective elongation of cavity structures along just one axis was accomplished using an angled ribbon ion beam in accordance with embodiments of the disclosure. The angled ribbon ion beam was provided in a reactive ion etching recipe to selectively etch material of the cavity. In various non-limiting embodiments the cavities may have a width (x-direction) in the range of 20 nm to 40 nm, before exposure, and may have a length (y-direction) on the order of 40 nm to 60 nm before exposure. Notably, the cavities may be elongated substantially along the Y-axis, such as 30 nm, 40 nm, 50 nm, or 60 nm, so the length increases to 80 nm to 100 nm, for example, while width increases along the X-axis direction by just several nanometers. In particular embodiments a directional selectivity of up to 15/1 has been accomplished, where the cavities increase along the Y-direction up to 15 times the increase along the X-direction.

FIG. 3A to FIG. 3J depict exemplary operations involved in another method according to embodiments of the disclosure. At FIG. 3A, a substrate 100 is provided, having a structure, generally as disclosed above with respect to FIG. 1D. At FIG. 3B, a subsequent instance is shown after filling and planarization with a material, where the material may be the same as the material of linear structures 108A, such as amorphous silicon. At FIG. 3C a mask 150 is provided, similar to the mask 114, discussed above. In this embodiment, the mask 150 may be formed of a plurality of linear structures disposed at a non-zero angle (within the X-Y plane) with respect to the linear structures 108A, while not necessarily at 90 degrees. This non-90 degree orientation is suggested in FIG. 4C by inspection of the spacers 110, disposed parallel to the Y-axis, while the long direction of the linear structures of the mask 150 are not aligned parallel to the X-axis.

Figure 3A:
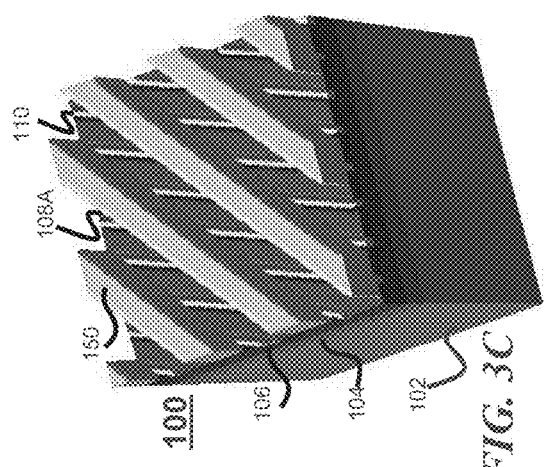
FIG. 3A to FIG. 3J depict exemplary operations involved in another method according to embodiments of the disclosure.
Figure 3D:
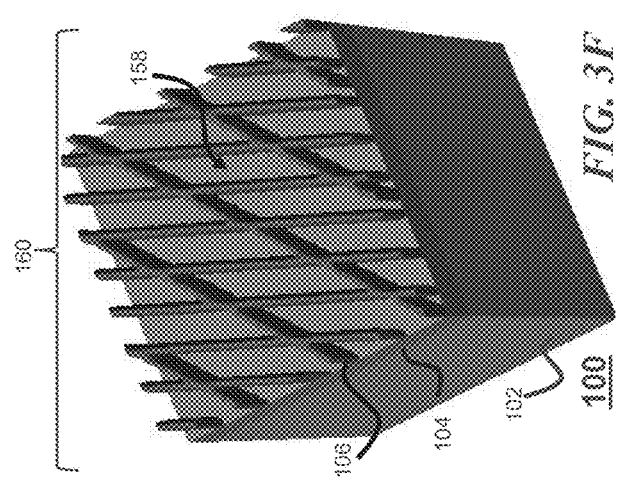
Figure 3B:
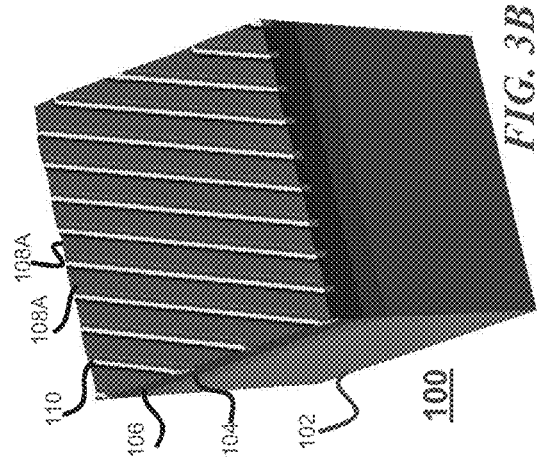
Figure 3E:
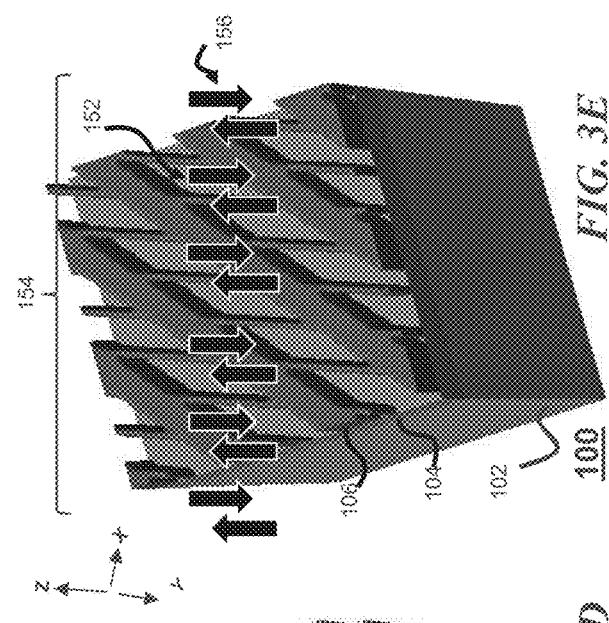
Figure 3C:
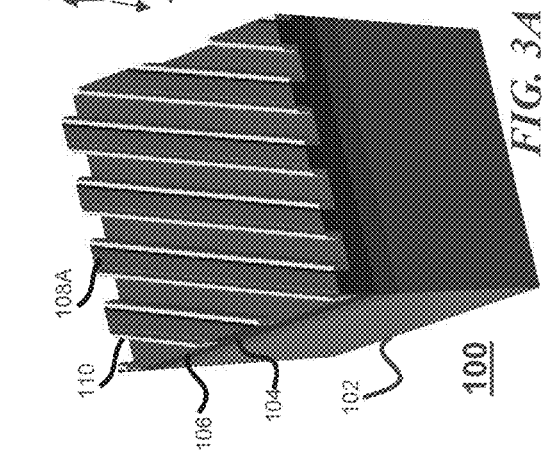
Figure 3F:
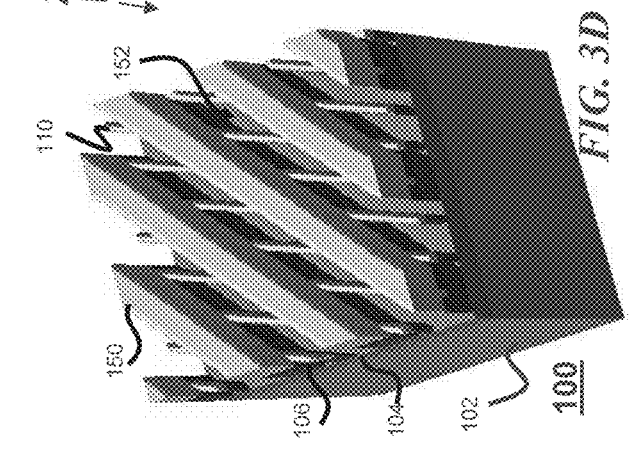

At FIG. 3D, with the mask 150 in place, a selective etch is performed to selectively remove the material of linear structures 108A, such as amorphous silicon. A known etchant, including a directional reactive ion etching process may be used for this operation. At FIG. 3E, a subsequent instance is shown after a series of operations has been performed. The mask 150 has been removed, while material of the linear structures 108A is also removed, as well as the spacers 110, using known etch recipes, leaving in place an etch pattern 154, embodied in the second layer 106. FIG. 3E also illustrates the provision of an angled ion beam 156, provided generally as disclosed above with respect to FIG. 1M. Notably, the ions of the angled ion beam 156 may be directed parallel to the Y-axis, not etching the sidewalls of cavities 152 oriented in the Y-Z plane. Notably, as suggested in the specific scenario of FIG. 3E the angled ion beam 156 may be a pair of ion beams, oriented along a given axis, while facing opposite directions to strike angled sidewalls. Thus, the sidewalls of the cavities 152 oriented at an angle with respect to the Y-Z plane are etched, thus elongating the cavities 152 to form elongated cavities 158, forming a second etch pattern, shown as etch pattern 160 in FIG. 3F.

Figure 3G:
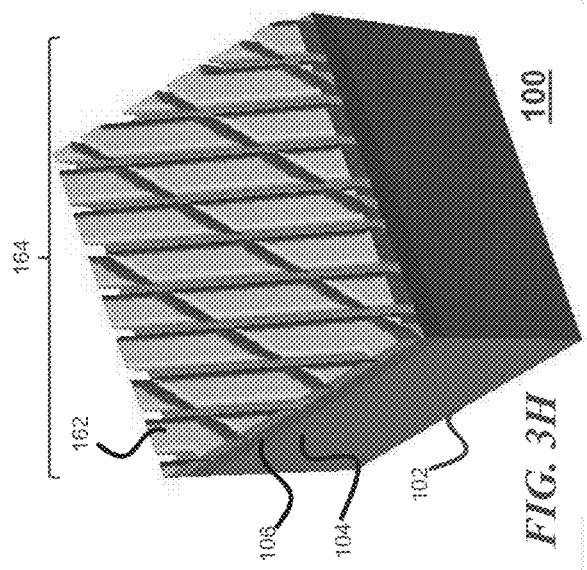
Figure 3H:
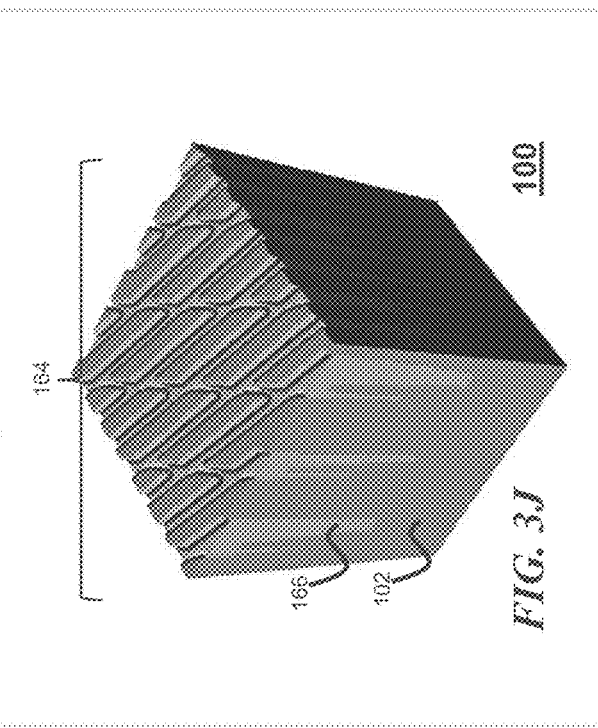
Figure 3I:
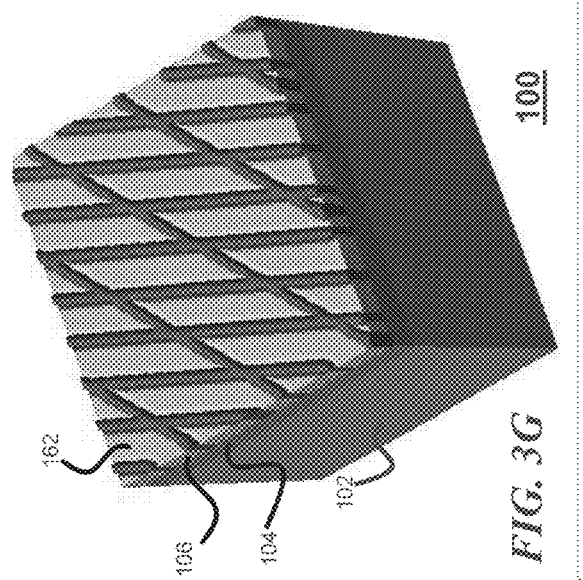
Figure 3J:
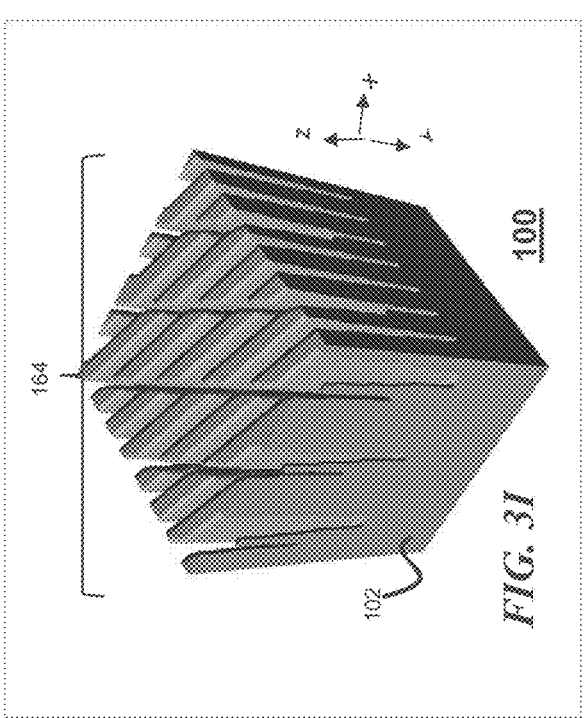

Turning to FIG. 3G and FIG. 3H, there is shown an operation of tone reversal, proceeding similarly to the operations as described with respect to FIG. 1O and FIG. 1P. A fill material 162 is deposited and planarized (FIG. 3G), followed by selective removal of the remainder of second layer 106, to generate the isolation pattern 164, shown in FIG. 3H. Subsequently, the isolation pattern 164 may be transferred into first layer 104, using a known RIE recipe, for example, to selectively etch the first layer 104 with respect to the fill material 162. Another selective etch process may be performed to transfer the isolation pattern 164 from the first layer 104 into the substrate base 102, followed by removal of the first layer 104. The final isolation pattern, also shown as isolation pattern 164, is etched into the substrate base 102 to a designed depth, as shown in FIG. 3I. Isolation insulator 166 may then be filled between fins of the final structure, as shown in FIG. 3J.

Figure 4:
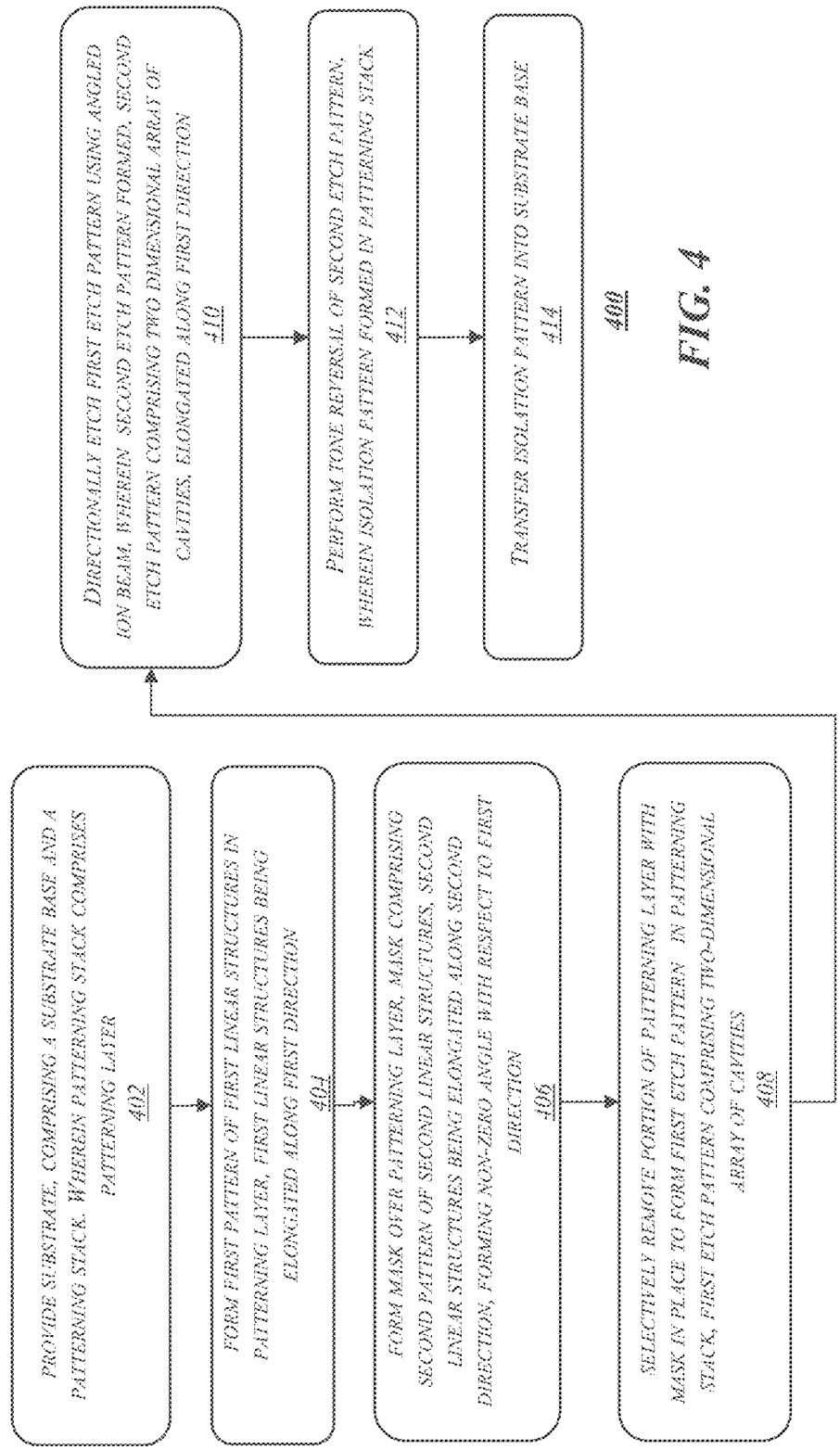
FIG. 4 presents an exemplary process flow according to an embodiment of the disclosure.

FIG. 4 depicts an exemplary process flow 400, according to embodiments of the disclosure. At block 402, a substrate is provided. The substrate may include a substrate base and a patterning stack, disposed on the substrate base. In various embodiments, the substrate base may be a monocrystalline semiconductor, while the patterning stack includes different layers, such as oxide, nitride, carbon, carbide, and so forth. As such the patterning stack may form a patterning layer in at least one layer of the patterning stack, where other layers of the patterning stack may be referred to as patterning stack layers.

At block 404, a first pattern of first linear structures is formed in the patterning layer, where the first linear structures are elongated along a first direction.

At block 406, a mask is formed over the patterning layer. The mask may be formed of second linear structures, elongated along a second direction, forming a non-zero angle with respect to the first direction.

At block 408, a portion of the patterning layer is selectively removed with the mask in place to form a first etch pattern in the patterning stack. The first etch pattern may comprise a two-dimensional array of cavities. In some embodiments, at this instance, the first etch pattern may be present in the patterning layer, while patterning stack layers of the pattering stack, disposed subjacent to the patterning layer, are unpatterned.

At block 410, the first etch pattern is directionally etched using an angled ion beam, wherein a second etch pattern is formed. The second etch pattern may comprise the two-dimensional array of cavities, where the cavities are elongated along the first direction. At the same time the cavities may retain the same dimension along a second direction, oriented at an angle with respect to the first direction.

At block 412, a tone reversal is performed of the second etch pattern to form an isolation pattern with the patterning stack. At block 414, the isolation pattern is transferred into the substrate base, for example, using known etching processes. These known etching processes ma include vertical etching, such as reactive ion etching.

The present embodiments provide various advantages over known processing to form devices such as arrays of semiconductor structures for forming DRAM transistors. For one advantage, device structures, such as active memory arrays, may be formed where DRAM tip node to tip requirements are met using novel selective elongation of cavities forming an etch pattern, using just self-aligned processes. For another advantage, no chop masks, such as extreme ultraviolet (EUV) or other chop masks are required. For another advantage, overlay challenges are reduced significantly by eliminating mask alignment operations.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, the present disclosure has been described herein in the context of a particular implementation in a particular environment for a particular purpose, while those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method, comprising:
   providing a substrate, the substrate comprising a patterning stack, the patterning stack comprising a patterning layer;
   forming a first pattern, comprising first linear structures, in the patterning layer, the first linear structures being elongated along a first direction;
   forming a mask over the patterning layer, the mask comprising a second pattern, comprising second linear structures, the second linear structures being elongated along a second direction, the second direction forming a non-zero angle with respect to the first direction;
   selectively removing a portion of the patterning layer while the mask is in place, wherein a first etch pattern is formed in the patterning stack, the first etch pattern comprising a two-dimensional array of cavities;
   directionally etching the first etch pattern using an angled ion beam, wherein a second etch pattern is formed, the second etch pattern comprising the two-dimensional array of cavities, elongated along the first direction, wherein the directionally etching comprises directing an ion beam at a non-zero angle of incidence with respect to a perpendicular to a plane of the substrate, wherein the ion beam does not strike a first set of sidewalls of the two-dimensional array of cavities, the first set of sidewalls oriented along the first direction, and wherein the ion beam strikes a second set of sidewalls of the two-dimensional array of cavities, the second set of sidewalls being oriented at a non-zero angle with respect to the first set of sidewalls.

2. The method of claim 1, wherein, before the forming the mask, the patterning layer comprises regions of a fill material, interspersed between the first linear structures.

3. The method of claim 2, wherein the regions of the fill material are formed by a blanket deposition of the fill material, followed by a planarization process.

4. The method of claim 2, wherein the selectively removing comprises:
   directing ions to the patterning layer while the mask is in place, wherein a plurality of implanted regions of the first linear structures, and implanted portions of the fill material are formed in exposed regions of the mask; and
   selectively etching the implanted portions of the fill material with respect to the implanted regions of the first linear structures.

5. The method of claim 4, wherein the ions comprise hydrogen, helium, carbon, oxygen, nitrogen, or any combination thereof.

6. The method of claim 4, further comprising:
   after the selectively removing a portion of the patterning layer, removing the mask, wherein a plurality of unimplanted regions of the first linear structures, and unimplanted regions of the fill material are exposed; and
   etching the patterning layer to selectively remove the plurality of unimplanted regions of the first linear structures, wherein the first etch pattern is formed.

7. The method of claim 6, further comprising, wherein the plurality of unimplanted regions of the first linear structures comprise amorphous silicon, the plurality of implanted regions of the first linear structures comprise SiC, and the plurality of unimplanted regions of the fill material comprise silicon oxide.

8. The method of claim 3, further comprising forming a plurality of spacers along sidewalls of the first linear structures before the blanket deposition of the fill material.

9. The method of claim 8, wherein the plurality of spacers comprise a SiCN material or a SiBN material.

10. The method of claim 1, wherein the first etch pattern is initially formed in the patterning layer, wherein the patterning stack comprises at least one additional layer, subjacent the patterning layer, the method further comprising transferring the first etch pattern from the patterning layer to an additional layer of the at least one additional layer.

11. The method of claim 10, further comprising: removing the patterning layer after the transferring the first etch pattern.

12. A method, comprising:
    providing a substrate, the substrate comprising a substrate base and a patterning stack, disposed on the substrate base, the patterning stack comprising a patterning layer;
    forming a first etch pattern in the patterning stack, the first etch pattern comprising a two-dimensional array of cavities;
    directionally etching the first etch pattern using an angled ion beam, wherein a second etch pattern is formed, the second etch pattern comprising the two-dimensional array of cavities, elongated along a first direction, wherein the directionally etching comprises directing an ion beam at a non-zero angle of incidence with respect to a perpendicular to a plane of the substrate, wherein the ion beam does not strike a first set of sidewalls of the two-dimensional array of cavities, the first set of sidewalls oriented along the first direction, and wherein the ion beam strikes a second set of sidewalls of the two-dimensional array of cavities, the second set of sidewalls being oriented at a non-zero angle with respect to the first set of sidewalls; and performing a tone reversal of the second etch pattern, to form an isolation pattern within a patterning stack layer of the patterning stack, subjacent to the patterning layer.

13. The method of claim 12, wherein the second etch pattern is formed in a layer material in a patterning stack layer, subjacent the patterning layer, wherein the performing the tone reversal comprises:
    depositing a reversing layer comprising reversing layer material on the patterning stack layer, after the second etch pattern is formed;
    planarizing the reversing layer; and
    selectively etching the layer material of the patterning stack layer with respect to the reversing layer material.

14. The method of claim 12, wherein the forming the first etch pattern comprises:
    forming a first pattern, comprising first linear structures, in the patterning layer, the first linear structures being elongated along a first direction;
    forming a mask over the patterning layer, the mask comprising a second pattern, comprising second linear structures, the second linear structures being elongated along a second direction, the second direction forming a non-zero angle with respect to the first direction; and
    selectively removing a portion of the patterning layer while the mask is in place.

15. A method of forming a memory array, comprising:
    providing a substrate, the substrate comprising a substrate base, formed of monocrystalline semiconductor, and a patterning stack, disposed on the substrate base, the patterning stack comprising a patterning layer, and at least one additional layer, subjacent the patterning layer,
    the patterning stack comprising a first etch pattern, wherein the first etch pattern comprising a two-dimensional array of cavities;
    directionally etching the first etch pattern using an angled ion beam, wherein a second etch pattern is formed, the second etch pattern comprising the two-dimensional array of cavities, elongated along a first direction, wherein the forming the first etch pattern comprises:
    forming a first pattern, comprising first linear structures, in the patterning layer, the first linear structures being elongated along a first direction; forming a mask over the patterning layer, the mask comprising a second pattern, comprising second linear structures, the second linear structures being elongated along a second direction, the second direction forming a non-zero angle with respect to the first direction; and selectively removing a portion of the patterning layer while the mask is in place;
    performing a tone reversal of the second etch pattern, to form an isolation pattern within the at least one additional layer; and
    transferring the isolation pattern into the substrate, wherein an active memory array is formed in the substrate base.

16. The method of claim 15, wherein, before the forming the mask, the patterning layer comprises regions of a fill material, interspersed between the first linear structures.

17. The method of claim 16, wherein the selectively removing comprises:
    directing ions to the patterning layer while the mask is in place, wherein a plurality of implanted regions of the first linear structures, and implanted portions of the fill material are formed in exposed regions of the mask; and
    selectively etching the implanted portions of the fill material with respect to the implanted regions of the first linear structures.

* * * * *